United States Patent [19]
Nowogrodzki

[11] 4,247,822
[45] Jan. 27, 1981

[54] FREQUENCY TRANSLATION MEANS

[75] Inventor: Markus Nowogrodzki, Sussex, N.J.

[73] Assignee: RCA Corporation, New York, N.Y.

[21] Appl. No.: 812

[22] Filed: Jan. 4, 1979

[51] Int. Cl.³ .......................................... H03B 21/01
[52] U.S. Cl. ........................................ 328/15; 455/20;
455/22; 328/39; 328/159; 331/37
[58] Field of Search ................... 328/39, 158, 159, 15;
325/9, 11, 65, 420; 343/179; 331/37

[56] References Cited
U.S. PATENT DOCUMENTS

| | | | |
|---|---|---|---|
| 2,407,213 | 9/1946 | Tunick | 325/11 X |
| 2,852,671 | 9/1958 | Cohen | 328/39 X |
| 3,317,909 | 5/1967 | Waetjen | 325/11 X |
| 3,325,736 | 6/1967 | Waetjen | 325/65 |
| 3,886,452 | 5/1975 | Seidel | 325/11 |

*Primary Examiner*—John S. Heyman

*Attorney, Agent, or Firm*—Samuel Cohen; Harold Christoffersen; Donald W. Phillion

[57] ABSTRACT

A method and means for translating frequencies, as for example, to correct a frequency error $\Delta f_d$ introduced into a carrier signal of frequency $f_c$, comprising means for dividing the resultant signal frequency $(f_c + \Delta f_d)$ by N, resulting in a divided-down frequency $(f_c/N + \Delta f_d/N)$, with $\Delta f_d$ being reduced to $\Delta f_d/N$, and then heterodyning the divided-down frequency with signal of frequency $(f_c + f_c/N)$ to produce a resultant signal of frequency $(f_c + \Delta f_d/N)$, the frequency error remaining at its low, divided level $\Delta f_d/N$. In the case of two or more signals spaced apart by predetermined frequency spacings, such frequency spacings can be reduced to predetermined values by dividing said signals by a common divisor M with the frequency spacings also being divided by M and then heterodyning the divided-down frequencies upwardly to desired frequencies with the frequency spacings remaining at their desired reduced values.

4 Claims, 1 Drawing Figure

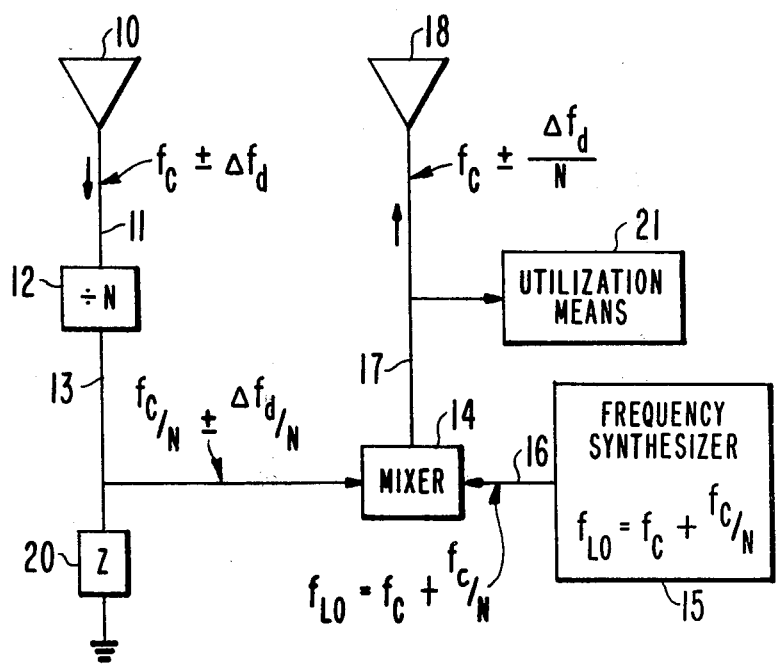

FREQUENCY TRANSLATION MEANS

This invention relates generally to means for translating frequencies and particularly to the correction of frequency errors in certain types of signals such as on-off keyed carrier signals, including pulsed beacons, and also to the reduction of frequency spacings between two or more signals.

Transmitted signals frequently acquire frequency errors owing, for example, to transmission media effects or to the Doppler effect when the transmitting and receiving systems are moving with respect to each other.

As an example, a satellite beacon having an 8 GHz frequency, might have acquired a Doppler frequency shift at a shipborne receiver of 2 kHz. A well-known manner of correcting for such a Doppler frequency error is to heterodyne the signal frequency downwardly to a lower frequency, as for example, to 4 MHz where the error, which remains at 2 kHz, is easier to correct. Thus, the percentage of frequency error (frequency error divided by carrier frequency) has increased by a substantial factor of 2000.

The correction of such large frequency errors can involve considerable circuitry, often including more than one phase-lock loop means.

The present invention provides an improved means for translating frequencies which can be employed to correct erroneous frequency shifts, such as Doppler frequency shifts, in certain types of transmitted signals such as on-off keyed carriers, or to reduce larger than desired frequency spacings between two or more signals to produce resultant signals having the desired frequency spacings. In one form of the invention, a received carrier signal of nominal frequency $f_c$, has a frequency error of $\Delta f_d$. The resultant frequency $(f_c \pm \Delta f_d)$ is divided by a suitable factor N to produce a signal of frequency $(f_c/N \pm \Delta f_d/N)$ with the error frequency being reduced to $\Delta f_d/N$. The divided signal frequency $(f_c/N \pm \Delta f_d/N)$ is then heterodyned with a signal of frequency $(f_c/N \pm f_c)$ to produce a resultant signal of frequency $(f_c \pm \Delta f_d/N)$, the frequency error remaining at its reduced value $\Delta f_d/N$).

In another application of frequency translation provided by the invention the frequencies of two or more original signals having larger than desired frequency spacings are divided to produce the desired reduced frequency spacings. The frequencies of the divided-down signals are then heterodyned upwardly to desired resultant values with the frequency spacings remaining at their desired reduced values. The frequencies of the original signals must be selected so that the frequencies of the resultant signals after division and heterodyning will have desired values.

The sole FIGURE is a block diagram of one form of the invention with the signals generated at various points therein being indicated.

In the drawing, a signal of frequency $(f_c \pm \Delta f_d)$ is received by antenna 10, where $f_c$ is the carrier signal, assumed for purposes of discussion to have a frequency of 8 GHz, and $\Delta f_d$ is a 2 kHz frequency error component.

The received signal of frequency $(f_c \pm \Delta f_d)$ is divided by N by divider 12 to produce on the output terminal 13 of divider 12 a signal of frequency $(f_c/N \pm \Delta f_d/N)$. N can be made equal to any number. If N is equal to 2000 the error frequency $\Delta f_d$ is reduced to 1 Hz.

The signal of frequency $(f_c/N \pm \Delta f_d/N)$ is supplied to mixer 14 as is the local oscillator output signal of frequency $(f_{Lo} = f_c + f_c/N)$, generated by frequency synthesizer 15. The frequency of the resultant heterodyned output signal from mixer 14 is:

$$f_c \pm \Delta f_d/N,$$

with the error frequency component $\Delta f_d/N$ remaining equal to only 1 Hz, compared with the original error frequency of 2 kHz received at input antenna 10.

The output of mixer 14 can be retransmitted by antenna 18 or it can be processed by utilization means 21 for the extraction of data or other purposes.

On first impression, it might appear redundant to mix the divided-down received signal of frequency $(f_c/N \pm \Delta f_d/N)$ with the local oscillator output signal of frequency $(f_{Lo} = f_c + f_c/N)$ to obtain $f_c$, since $f_c$ obviously can be generated directly by synthesizer 15 with very little frequency error. However, as indicated above, in some applications the received signal is encoded, as for example, by pseudo-random sequencing effected by on-off keying. In such cases the beacon signal frequency must be corrected and retransmitted with the same on-off keying pattern as was present in the originally transmitted signal. The supplying of the signal of frequency $(f_c + f_c/N)$ from synthesizer 15 to mixer 14 will result, in the absence of the received divided-down signal of frequency $(f_c/N \pm \Delta f_d/N)$ also being supplied to mixer 14, in an output signal from mixer 14 of frequency $(f_c + f_c/N)$, a frequency well removed from the desired frequency $f_c$ and easily prevented from retransmission by suitable filter means.

It is to be noted that the division of frequency can be accomplished in more than one step, as can be the heterodyning upwardly of the frequencies. Further, in some applications it might be desirable to repeat the division and heterodyning sequence a second time.

In another application the invention employing the same structure as shown in the sole drawing, but with signals of different frequencies, is employed to generate a band of signal frequencies spaced apart by predetermined frequency differences. More specifically, a band of signals can originally be generated at relatively high frequencies with the frequency spacing therebetween being larger than the spacing ultimately desired. The entire band of frequencies can then be divided down, with the frequency spacings being reduced to their desired low values. Subsequently, the entire band of frequencies can be heterodyned back up to desired values, but with the frequency spacings remaining at their desired low values. The frequencies of the original signals must be selected so that they have the desired values after the division and heterodyning processes have been completed.

For example, signals having original frequencies $f_c$, $(f_c + \Delta f_{d1})$, $(f_c + \Delta f_{d2})$ ... $(f_c + \Delta f_{dn})$ can be translated to resultant signals having frequencies $(f_c/N + f_o)$, $(f_c/N + f_o + \Delta f_{d1}/N)$, $(f_c/N + f_o + \Delta f_{d2}/n)$ ... $(f_c/n + f_o + \Delta f_{dn}/N)$, by dividing the original frequencies by N and then heterodyning the signals having the divided-down frequencies by a signal of frequency $f_o$. If originally $\Delta f_{d1} = (\Delta f_{d2}/2) = (\Delta f_{dn}/n)$, there will result a band of signals having frequencies separated by a frequency spacing $\Delta f_{d1}/N$. It is apparent that the frequency of a single signal can be translated in the above-described manner.

What is claimed is:

1. A method for translating the frequency of a plurality of original signals having frequencies $(f_c+\Delta f_{d1})$, $(f_c+\Delta f_{d2}) \ldots (f_c+\Delta f_{dn})$ to resultant signals having frequencies $(f_c/N+f_o+\Delta f_{d1}/N)$, $(f_c/N+f_o+\Delta f_{d2}/N) \ldots (f_c/N+f_o+\Delta f_{dn}/N)$ comprising the steps of:

dividing the frequencies of said original signals by N; and heterodyning the divided-down frequencies of the original signals by a signal of frequency $f_o$.

2. A method as in claim 1 in which $f_o = f_c - f_c/N$.

3. A method for generating a resultant plurality of signals having frequencies $(f_c/N+f_o+\Delta f_{d1}/N)$, $(f_c/N+f_o+\Delta f_{d2}/N) \ldots (f_c/N+f_o+\Delta f_{dn}/N)$ comprising the steps of:

generating a first plurality of signals having frequencies $(f_c+\Delta f_{d1})$, $(f_c+\Delta f_{d2}) \ldots (f_c+\Delta f_{dn})$;

dividing the frequencies of said first plurality of signals by N; and heterodyning the divided-down frequencies of said first plurality of signals by a signal of frequency $f_o$.

4. Means for generating a resultant plurality of signals having frequencies $(f_c/N+f_o+\Delta f_{d1}/N)$, $(f_c/N+f_o+\Delta f_{d2}/N) \ldots (f_c/N+f_o\Delta f_{dn}/N)$ comprising:

means for generating a first plurality of signals having frequencies $(f_c+\Delta f_{d1})$, $(f_c+\Delta f_{d2}) \ldots (f_c+\Delta f_{dn})$;

means for dividing the frequencies of said first plurality of signals by N; and means for heterodyning the divided-down frequencies of said first plurality of signals by a signal of frequency $f_o$.

* * * * *